United States Patent [19]
Koifman et al.

[11] Patent Number: 5,777,516
[45] Date of Patent: Jul. 7, 1998

[54] HIGH FREQUENCY AMPLIFIER IN CMOS

[75] Inventors: Vladimir Koifman, Rishon-Lezion; Yachin Afek, Kfar Saba; Israel Kashat, Netanya, all of Israel

[73] Assignee: Motorola, Inc., Schaumburg, Ill.

[21] Appl. No.: 696,080

[22] Filed: Aug. 13, 1996

[51] Int. Cl.[6] .................... H03F 3/16; H03G 3/30
[52] U.S. Cl. ................ 330/277; 330/285; 330/294
[58] Field of Search ........................ 330/277, 285, 330/286, 292, 294

[56] References Cited

U.S. PATENT DOCUMENTS 4,484,148  11/1984  Wieser et al. .............. 330/294 X
5,497,125  3/1996   Royds ...................... 330/285 X

*Primary Examiner*—Steven Mottola
*Attorney, Agent, or Firm*—Robert M. Handy

[57] ABSTRACT

A high frequency monolithic amplifier (100) is provided which can be used, for example, in the PLL prescaler of cellular radio systems. The amplifier (100) amplifies single-ended signals having a frequency in the GHz area. It includes a feedback unit (160) which uses parasitic capacitors. The feedback depends on the frequency and is positive for high frequencies and negative for low frequencies. A high gain can be obtained for high frequencies. A comparative low gain a low frequencies prevents the propagation of noise. The amplifier (100) of the present invention can be cascaded to an, for example, 3 stage amplifier arrangement (300).

9 Claims, 2 Drawing Sheets

-PRIOR ART-

HIGH FREQUENCY AMPLIFIER IN CMOS

FIELD OF THE INVENTION

This invention relates to a high frequency amplifier operating at very high frequencies (e.g., GHz) and having a comparatively large passband $\Delta f$.

BACKGROUND OF THE INVENTION

Telecommunication applications often need wideband amplifiers operating at high frequencies up to 3 GHz which have a pass band $\Delta f$ of 1 GHz or more. Such applications can be, for example, radio frequency PLL prescalers in cellular radio systems. For telecom standards such as GSM, NADC, DECT, a prescaler must operate at signal frequencies up to 900 MHz and 1.8 GHz.

Preferably, the frequency response of the amplifier should be linear with equal gain at low and high frequencies ($f_{LOW}$, $F_{HIGH}$) inside $\Delta f$. However, amplifiers of prior art typically have relatively low gain at high frequencies $F_{HIGH}$ and high gain at low frequencies $f_{LOW}$.

FIG. 1 shows a simple prior art implementation of a wide band amplifier. It comprises 5 serially coupled inverter stages each having a gain $g_0=1.1$ for $f_{HIGH}=1$ GHz and $g_0=10$ for $f_{LOW}=10$ MHz. The resulting gains $g_R=1.6$ for $F_{HIGH}$ and $g_R=10^5$ for $f_{LOW}$ are different and therefore not desirable. This results in the undesirable propagation of spikes and other low frequency noise which can degrade signal clarity.

It is difficult to use local feedback resistors for every inverter stage. While a resistor does not by itself decrease the high frequency gain, it also behaves as a Miller load to previous inverter stages, thus reducing the gain go at $F_{HIGH}$.

There is an ongoing need to provide an improved high frequency amplifier having increased high frequency gain and reduced low frequency gain, in the frequency range of interest for modern telecom applications, using low cost, standard digital CMOS processes and consuming low power.

DETAILED DESCRIPTION OF THE DRAWINGS

Figure 2:
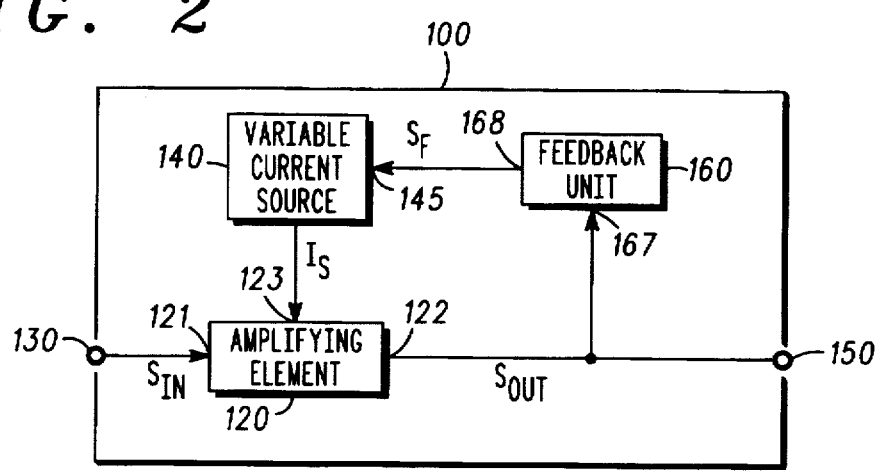
FIG. 2 shows a simplified block diagram of a high frequency amplifier according to the present invention.

FIG. 2 is a simplified block diagram of high frequency amplifier 100 according to the present invention. Amplifier 100 comprises amplifying element 120, feedback unit 160, and variable current source 140. Input terminal 130 is provided for receiving input signal $S_{in}$ and output terminal 150 for supplying output signal $S_{out}$.

Input terminal 130 of amplifier 100 is coupled to input 121 of amplifying element 120. Output 122 of amplifying element 120 is coupled to output terminal 150 and to input 167 of feedback unit 160. At supply input 123, amplifying element 120 is coupled to variable current source 140. Control input 145 of variable current source 140 is coupled to output 168 of feedback unit 160 for receiving a feedback signal $S_F$ from feedback unit 160.

Input signal $S_{in}$ and output signal $S_{out}$ have signal frequency $f_S$. The frequency $f_S$ is inside the pass band $\Delta f$ which is enclosed by lower frequencies $f_{LOW}$, and higher frequencies $f_{HIGH}$. Signals $S_{in}$, $S_{out}$ have the voltages $V_{in}$ and $V_{out}$, respectively. The gain $g_0$ of amplifier 100 is defined as $V_{out}/V_{in}$.

Amplifying element 120 is fed at supply input 123 by current $I_S$ of variable current source 140. Input signal $S_{in}$ is amplified in amplifying element 120 and sent to output terminal 150 and feedback unit 160. Feedback signal $S_F$ depends on the signal frequency $f_S$. The gain $g_0$ of amplifier 100 depends on the current $I_S$ of variable current source 140. Current $I_S$ depends on feedback signal $S_F$.

Negative feedback reducing the gain $g_0$ is generated for lower frequencies $f_{LOW}$. Accordingly, the gain $g_0$ is enhanced for higher frequencies $f_{HIGH}$ by positive feedback.

With the described configuration of amplifier 100, a feedback is created which can be either positive or negative, thus increasing or decreasing gain $g_0$.

Comparing to known amplifier of prior art where the feedback is for all frequencies in a pass band $\Delta f$ either positive or negative, the feedback of amplifier 100 can be negative for $f_{LOW}$, and positive for $f_{HIGH}$.

Figure 1:
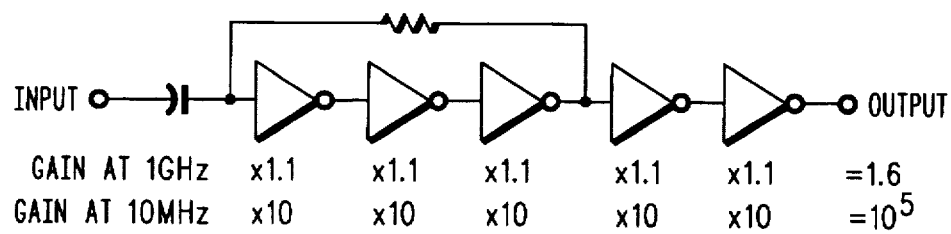
FIG. 1 shows a simplified block diagram of an amplifier arrangement of prior art comprising inverter stages.

The circuit of amplifier 100 solves problems which are inherent for amplifiers:

a) It reduces the high gain $g_0$ at frequencies $f_{LOW}$, that tends to destabilize amplifiers when they are cascaded like in FIG. 1.

b) It compensates the $f_{HIGH}$ gain drop caused by frequency limitations of the transconductance $g_m$ of transistors.

c) A standard CMOS amplifier having a low power consumption can be provided which operates at frequencies above 1 GHz with a gain larger than the unity gain.

Figure 3:
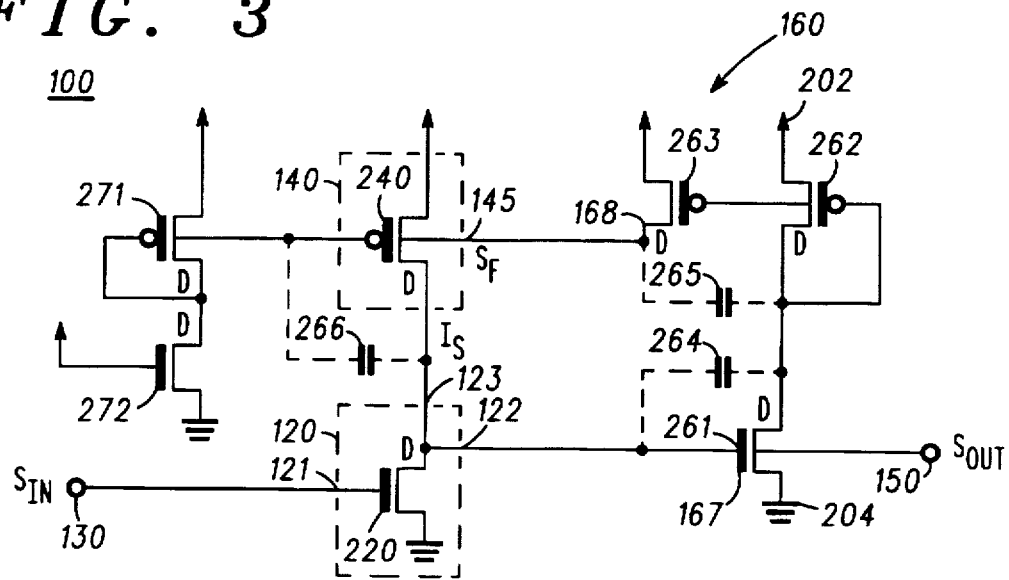
FIG. 3 shows a schematic circuit diagram of the amplifier of FIG. 2 according to a first embodiment of the invention.

FIG. 3 shows a schematic circuit diagram of amplifier 100 in a first embodiment of the invention. Various modification can be done by a person skilled in the art without departing from the scope of the invention.

In the first embodiment, amplifier 100 comprises N-channel field effect transistors (FET) 220, 261, 272 and P-channel field effect transistors 240, 262, 263, 271. The P-channel FET are symbolized by a circle at the gate. For all transistors, the drain is indicated by the letter symbol 'D'. That distinction between source and drain is convenient, but not necessary for the implementation of the invention.

The blocks of FIG. 2 can be coordinated to the elements of FIG. 3 as follows:

Amplifying element 120 is transistor 220 with the gate as input 121 and the drain having the functions of supply input 123 and output 122.

Variable current source 140 is implemented by transistor 240 with the gate in the function of control input 145.

Feedback unit 160 is implemented by transistors 261, 262, 263 and parasitic capacitors 264, 265, 266. The gate of transistor 261 corresponds to input 167. The drain of transistor 263 corresponds to output 168. In FIG. 2 and FIG. 3, input terminal 130, output terminal 150 are identical.

In FIG. 3, connections to supply lines 202, 204 are indicated by arrows pointing up or pointing down, respectively. Supply line 204 can have the function of electrical ground. Bias transistors 271, 272 are provided to supply bias.

The gate of transistor 220 corresponds to input 121 and is coupled to input terminal 130 for receiving $S_{in}$. The source is coupled to supply line 204. The drain corresponds to output 122 and is coupled to output terminal 150 for providing $S_{out}$. The drain has also the function of supply input 123 and is therefore serially coupled via the drain-source (D-S) path of transistor 240 to supply line 202. As input 167 of feedback unit 160, the gate of transistor 261 is coupled to the drain of transistor 220. The source of transistor 261 is coupled to supply line 204, the drain is coupled via the D-S path of transistor 262 to supply line 202. The source of transistor 263 is coupled to supply line 202, the drain has the function of output 168 and is coupled to the gate of transistor 240. The gates of transistors 263, 262 are common and coupled to the drain of transistor 262.

In feedback unit 160, parasitic capacitor 265 is coupled between the drains of transistors 262 and 263. Parasitic capacitors 264, 266 are coupled between the drains and gates of transistors 261, 240, respectively. The implementation by parasitic capacitors provides immunity to fluctuations in the manufacturing process.

Bias transistors 271 and 272 are serially arranged with the S-D and D-S paths between supply lines 202 and 204. The gate of bias transistor 271 is coupled to the gate of transistor 240 and to the drain of bias transistor 271. The gate of bias transistor 272 is coupled to supply line 202.

The operation of amplifier 100 will now be described. Input signal $S_{in}$ goes from input terminal 130 to the output terminal 150 after being amplified by transistor 220. Feedback signal $S_F$ is generated by transistors 261, 262, 263 and parasitic capacitors 264, 265, 266. It is supplied to transistor 240. Parasitic capacitors 264, 265, 266 cause a frequency depending phase shift. Although not specially implemented as separate components in amplifier 100, parasitic capacitors 264, 265, 266 are part of feedback unit 160. With the phase shift the resulting feedback is negative for $f_{LOW}$ ($f_S$<150 MHz) and positive for $f_{HIGH}$ ($f_S \geq 1$ GHz).

As an example and not indented to be limiting the embodiment of the invention was implemented in CMOS-technology using P- and N-channel FET. Parasitic capacitors 264, 265, 266 are well matched with little fluctuation during the manufacturing process. Other configurations and manufacturing technologies can also be used, as it will be understood by persons skilled in the art. Especially, the transistors can be bipolar, GaAs, NMOS, PMOS, BiCMOS or other types.

Figure 4:
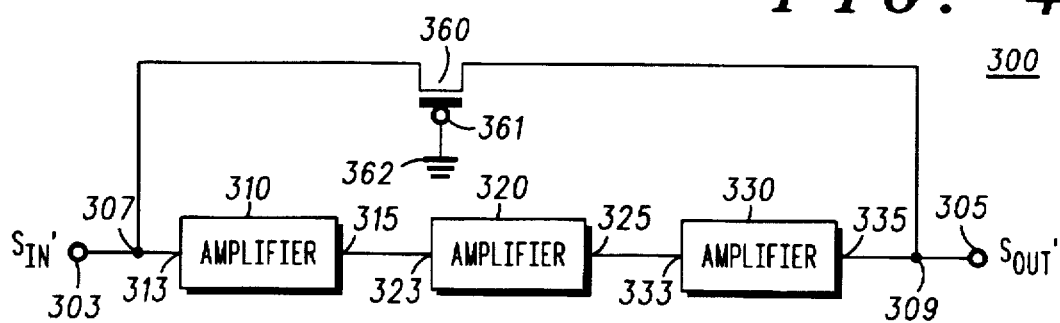
FIG. 4 shows an amplifier arrangement with 3 cascaded amplifiers of the type illustrated in FIG. 3.

FIG. 4 shows the combination of 3 amplifiers in a cascade as a further embodiment of the invention.

Amplifier arrangement 300 comprises serially coupled amplifiers 310, 320, 330 and feedback transistor 360. Amplifier 310, 320, 330 can be amplifier 100 as illustrated in FIG. 2 and 3.

Amplifier arrangement 300 has input terminal 303 for receiving input signal $S_{in}'$ and output terminal 305 for supplying output signal $S_{out}'$. Signals $S_{in}'$, $S_{out}'$ have the voltages $V_{in}'$ and $V_{out}'$, respectively. The resulting gain $g_R$ of amplifier arrangement 300 is defined as $V_{out}'/V_{in}'$.

Input terminal 303 is via node 307 coupled to input 313 of amplifier 310. Output 315 of amplifier 310 is coupled to input 323 of amplifier 320. Output 325 of amplifier 320 is coupled to input 333 of amplifier 330. Output 335 of amplifier 330 is via node 309 coupled to output terminal 305 of amplifier arrangement 300.

When amplifiers 310, 320, 330 are implemented by amplifier 100, input terminal 130 corresponds to input 313, 323 or 333. Output terminal 150 correspond to output 315, 325 or 335.

Feedback transistor 360 is coupled with the drain-source path between nodes 309 and 307. Gate 361 of feedback transistor 360 is coupled to reference terminal 362 (e.g., ground). Feedback transistor 360 is, for example, a P-channel FET. The 3 stage implementation of amplifier arrangement 300 is only an example. The number of amplifier stage can be changed. Feedback transistor 360 can be replaced by other means that provide a global feedback.

The gain of amplifier 100 and amplifier arrangement 300 will now be compared to the gain of prior art solutions.

Figure 5:
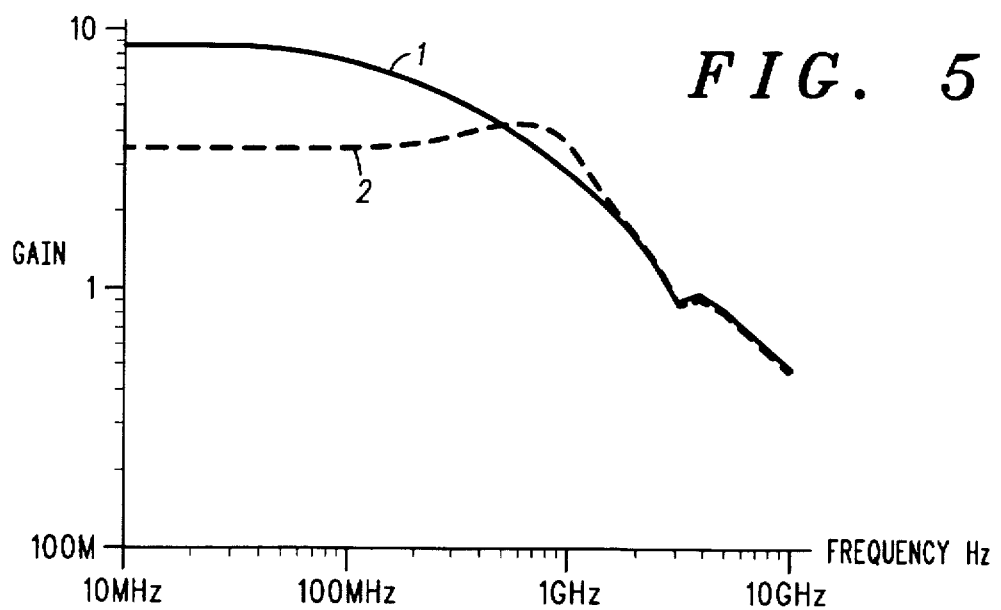
FIG. 5 shows a gain-frequency diagram comparing the amplifier of FIG. 2 with the amplifier of FIG. 1.
Figure 6:
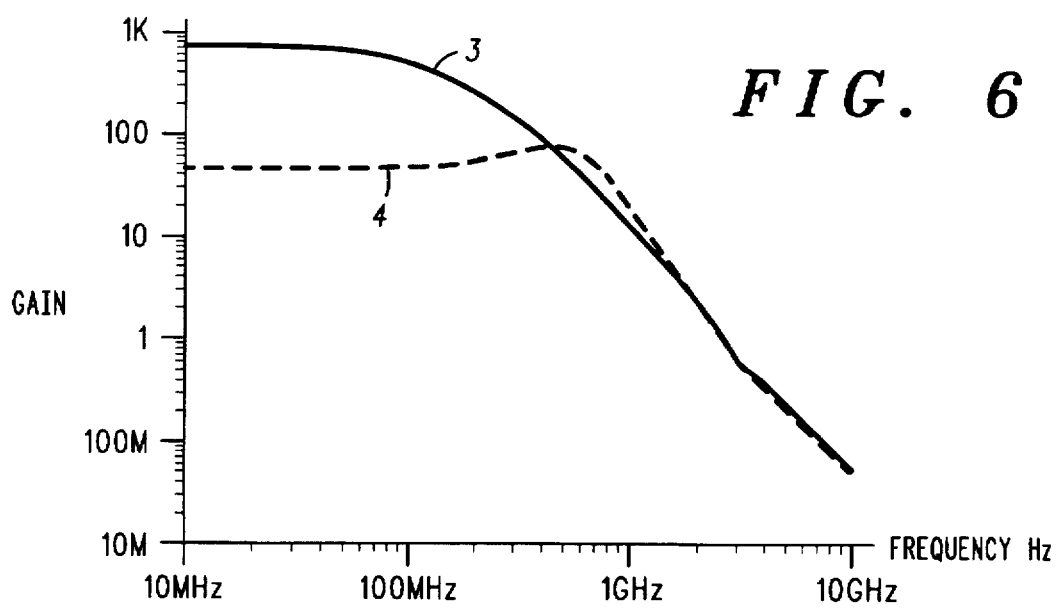
FIG. 6 shows a gain-frequency diagram comparing the amplifier arrangement of FIG. 4 with the amplifier arrangement of FIG. 1.

FIG. 5 and FIG. 6 are gain-frequency diagrams. The vertical axes show the gain g in a logarithmic scale. The horizontal axes show the frequency $f_S$ from $f_{LOW}$=10 MHz, over $f_{HIGH}$=1 GHz to $f_S$max=10 GHz. For $f_S$max, the gain g is less then unity.

FIG. 5 shows a gain-frequency diagram comparing amplifier 100 of the present invention in the first embodiment (FIG. 3) with a prior art amplifier.

The prior art amplifier is constructed like an amplifier 100 but does not have feedback unit 160. A constant current source is used instead of variable current source 140. Graph 1 (plain line) denotes the gain $g_0$ of the prior art amplifier. Graph 2 (dashed line) denotes the gain $g_0$ of amplifier 100.

As it can be seen from the diagram, both amplifiers have a pass band Δf exceeding 1 GHz. The unity gain frequency is about 1.3 GHz. For signal frequencies $f_S$ between 10 MHz and 100 MHz ($f_{LOW}$), the gain $g_0$ of amplifier 100 is 3-4 times less than for the prior art amplifier. For $f_S$ at around 900 MHz the gain $g_0$ is higher for amplifier 100. For example, that frequency is used to transmit data in above mentioned GSM systems.

FIG. 6 shows a gain-frequency diagram comparing the amplifier arrangement 300 with the prior art amplifier arrangement of FIG. 1. Graph 3 (plain line) denotes the resulting gain $g_R$ for the prior art amplifier arrangement of 5 inverter stages. Graph 4 (dashed line) denotes the gain $g_R$ for amplifier arrangement 300 comprising 3 amplifiers 100 implemented by a standard CMOS process with submicron feature sizes.

The resulting gains $g_R$ of both amplifier arrangements (FIG. 6) are higher than for single-stage amplifiers (FIG. 5).

Compared to the prior art arrangement, the resulting gain $g_R$ of amplifier arrangement 300 is for $f_S$ from 700 MHz to 1 GHz ($f_{HIGH}$) 1.3-1.6 times higher. For $f_S$ between 10 MHz and 100 MHz ($f_{LOW}$), the resulting gain $g_R$ is 3-4 times less.

It is also possible to construct an amplifier arrangement 300 having a gain-frequency relation as a prior art arrangement. In that case the power consumption can be reduced by 40%.

Amplifier arrangement 300 implemented in CMOS can yield similar gain with similar power consumption compared to a prior art amplifier implemented by a BiCMOS process.

Persons skilled in the art will understand that the amplifier according to this invention can be used in fields other than described above. It will be appreciated that although only one particular embodiment of the invention has been described in detail, various modifications and improvements can be made by a person skilled in the art based on the teachings herein without departing from the scope of the present invention.

We claim:

1. A high frequency amplifier including an input terminal and an output terminal, the high frequency amplifier comprising:

an amplifying element coupled to the input terminal and to the output terminal for amplifying an input signal $S_{in}$ to an output signal $S_{out}$, both signals having the frequency $f_S$ in a pass band $\Delta f$;

a variable current source for supplying a current $I_S$ to said amplifying element, said variable current source having a control input; and a feedback unit employing parasitic capacities, coupled to an output of said amplifying element for receiving the output signal $S_{out}$ and coupled to said control input of said variable current source for supplying a feedback signal $S_F$, wherein $I_S$ is combined with $S_{out}$ and not with $S_{in}$.

2. A high frequency amplifier including an input terminal and an output terminal, the high frequency amplifier comprising:

an amplifying element coupled to the input terminal and to the output terminal for amplifying an input signal $S_{in}$ to an output signal $S_{out}$, both signals having the frequency $f_S$ in a pass band $\Delta f$:

a variable current source for supplying a current $I_S$ to said amplifying element, said variable current source having a control input; and a feedback unit employing parasitic capacities, coupled to an output of said amplifying element for receiving the output signal $S_{out}$ and coupled to said control input of said variable current source for supplying a feedback signal $S_F$ for adjusting the gain of said amplifying element as a function of frequency.

wherein said amplifying element is a N-channel field effect transistor (FET) having the gate coupled to the input terminal, the drain coupled to said feedback unit and to the output terminal and the source coupled to a supply line.

3. A high frequency amplifier including an input terminal and an output terminal, the high frequency amplifier comprising:

an amplifying element coupled to the input terminal and to the output terminal for amplifying an input signal $S_{in}$ to an output signal $S_{out}$, both signals having the frequency $f_S$ in a pass band $\Delta f$:

a variable current source for supplying a current $I_S$ to said amplifying element, said variable current source having a control input; and a feedback unit employing parasitic capacities, coupled to an output of said amplifying element for receiving the output signal $S_{out}$ and coupled to said control input of said variable current source for supplying a feedback signal $S_F$ for adjusting the gain of said amplifying element as a function of frequency.

wherein said variable current source is a P-channel field effect transistor having the gate coupled to said feedback unit for receiving the feedback signal $S_F$.

4. The high frequency amplifier according to claim 1 wherein said feedback unit comprises parasitic capacitors which cause that said feedback signal $S_F$ is frequency dependent.

5. A high frequency amplifier including an input terminal and an output terminal, the high frequency amplifier comprising:

an amplifying element coupled to the input terminal and to the output terminal for amplifying an input signal $S_{in}$ to an output signal $S_{out}$, both signals having the frequency $f_S$ in a pass band $\Delta f$:

a variable current source for supplying a current $I_S$ to said amplifying element, said variable current source having a control input; and a feedback unit employing parasitic capacities, coupled to an output of said amplifying element for receiving the output signal $S_{out}$ and coupled to said control input of said variable current source for supplying a feedback signal $S_F$ for adjusting the gain of said amplifying element as a function of frequency.

wherein said feedback unit comprises:

a first transistor having a gate coupled to said amplifying element for receiving the output signal $S_{out}$ and a second transistor having the gate coupled to said first transistor and having either the drain or the source coupled to said control input of said variable current source for supplying the feedback signal $S_F$.

6. An amplifier arrangement including an input terminal and an output terminal, comprising:

a first high frequency amplifier having an amplifying element coupled to the input terminal and to the output terminal for amplifying an input signal $S_{in}$ to an output signal $S_{out}$, both signals having the frequency $f_S$ in a pass band $\Delta f$.

a variable current source for supplying a current $I_S$ to said amplifying element, said variable current source having a control input:

a feedback unit employing parasitic capacities, coupled to an output of said amplifying element for receiving the output signal $S_{out}$ and coupled to said control input of said variable current source for supplying a feedback signal SE for adjusting the gain of said amplifying element as a function of frequency;

a second high frequency amplifier such as said first high frequency amplifier, said first and second high frequency amplifiers being serially coupled; and a feedback transistor serially coupled with a source-drain path between said input terminal and said output terminal.

7. A high frequency amplifier for selectively amplifying the higher and the lower frequencies of an input signal $S_{in}$, said high frequency amplifier comprising:

a first transistor having a control electrode and a first and a second main electrodes, said control electrode of said first transistor being coupled to an input terminal of said amplifier, said first main electrode being coupled to a first supply line, said second main electrode being coupled to an output terminal of said amplifier;

a second transistor having a control electrode and a first and a second main electrodes, said first main electrode of said second transistor being coupled to a second supply line, said second main electrode being coupled to said second main electrode of said first transistor;

a third transistor having a control electrode and a first and a second main electrodes, said control electrode being coupled to the second main electrode of said first transistor, said first main electrode being coupled to said first supply line; and a fourth transistor having a control electrode and a first and a second main electrodes, said first main electrode being coupled to said second supply line, said second main electrode being coupled to said control electrode of said second transistor, said control electrode being coupled to said second main electrode of said third transistor.

8. The high frequency amplifier of claim 7 wherein said first and third transistors are field effect transistors (FET) of a first channel type and said second and fourth transistors are FET of the opposite channel type.

9. The high frequency amplifier of claim 8 wherein parasitic capacitors are implemented and used between a) said control electrode and said second main electrode of said second transistor;

b) said control electrode and said second main electrode of said third transistor; and c) said control electrode of said second transistor and said second main electrode of said third transistor.

* * * * *

UNITED STATES PATENT AND TRADEMARK OFFICE
CERTIFICATE OF CORRECTION

PATENT NO.   : 5,777,516
DATED        : July 7, 1998
INVENTOR(S)  : Vladimir Koifman et al.

It is certified that error appears in the above-identified patent and that said Letters Patent is hereby corrected as shown below:

<u>Column 5,</u>
Line 28, delete "." and add -- ; --.

<u>Column 6,</u>
Line 20, delete "." and add -- ; --.
Line 23, delete ":" and add -- ; --.
Line 28, delete "SE" and add -- $S_F$ --.
Line 66, delete "8" and add -- 7 --.

Signed and Sealed this

Thirtieth Day of July, 2002

*Attest:*

*Attesting Officer*

JAMES E. ROGAN
*Director of the United States Patent and Trademark Office*